(12) United States Patent
Sobczynski

(10) Patent No.: US 10,224,687 B1
(45) Date of Patent: Mar. 5, 2019

(54) LASER WITH INTRACAVITY NARROWBAND MAGNETO-OPTIC ATOMIC FILTER

(71) Applicant: Radoslaw M. Sobczynski, Orange, CT (US)

(72) Inventor: Radoslaw M. Sobczynski, Orange, CT (US)

( * ) Notice: Subject to any disclaimer, the term of this patent is extended or adjusted under 35 U.S.C. 154(b) by 87 days.

(21) Appl. No.: 15/181,744

(22) Filed: Jun. 14, 2016

Related U.S. Application Data

(60) Provisional application No. 62/182,812, filed on Jun. 22, 2015.

(51) Int. Cl.
*H01S 3/08* (2006.01)
*H01S 5/14* (2006.01)
(Continued)

(52) U.S. Cl.
CPC ........ *H01S 3/1066* (2013.01); *H01S 3/08054* (2013.01); *H01S 3/0941* (2013.01);
(Continued)

(58) Field of Classification Search
CPC .. H01S 3/1066; H01S 3/08054; H01S 3/0941; H01S 3/10023; H01S 3/18388; H01S 3/0619; H01S 5/14; H01S 5/4087; H01S 3/227; H01S 3/031; H01S 3/034; H01S 3/22; H01S 3/2235; H01S 3/2237; H01S 3/09; H01S 3/10; H05H 3/02; G02B 5/30; G01R 15/246; G01R 33/0322;
(Continued)

(56) References Cited

U.S. PATENT DOCUMENTS

| 3,550,858 A | 12/1970 | Herron et al. ............ 239/338 |
| 4,746,201 A | 5/1988 | Gould ...................... 350/394 |

(Continued)

FOREIGN PATENT DOCUMENTS

| CN | 101969178 | * | 2/2011 |
| CN | 102522687 | * | 6/2012 |
| CN | 204374552 | * | 6/2015 |

OTHER PUBLICATIONS

B. Yin et al. "A potassium Faraday anomalous dispersion optical filter", Proc. SPIE 1635, Free-Space Laser Communication Technologies IV, Jun. 9, 1992, pp. 128-134.*
(Continued)

*Primary Examiner* — Jessica S Manno
*Assistant Examiner* — Delma R Fordé
(74) *Attorney, Agent, or Firm* — Fattibene and Fattibene LLC; Paul A. Fattibene

(57) ABSTRACT

A laser using a laser diode and a narrow wavelength from a resonant atomic transition of a predetermined material. The gain range of the laser diode encompasses the wavelength of the resonant atomic transition. A vapor cell containing a material, such as a metal vapor, providing the resonant atomic transition forming the predetermined wavelength is placed between permanent magnets. In one embodiment the vapor cell has opposing windows positioned at a Brewster's angle and rotated 90° relative to each other. The laser produces a very narrow bandwidth of a predetermined wavelength with high power. The laser configuration eliminates several optical components reducing cost.

14 Claims, 4 Drawing Sheets

(51) Int. Cl.
  *H01S 5/40* (2006.01)
  *H01S 3/106* (2006.01)
  *H01S 3/227* (2006.01)
  *H01S 3/0941* (2006.01)
  *H01S 3/10* (2006.01)

(52) U.S. Cl.
  CPC .............. *H01S 3/227* (2013.01); *H01S 5/14* (2013.01); *H01S 5/4087* (2013.01)

(58) Field of Classification Search
  CPC ........... H01P 1/175; H01L 2924/01102; H01L 2924/01101
  See application file for complete search history.

(56) References Cited

U.S. PATENT DOCUMENTS

| | | | | |
|---|---|---|---|---|
| 5,192,978 | A * | 3/1993 | Keeler | G01S 7/493 348/81 |
| 5,218,610 | A | 6/1993 | Dixon | 372/20 |
| 5,249,189 | A | 9/1993 | Scheps | 372/20 |
| 5,267,010 | A * | 11/1993 | Kremer | G01J 3/12 356/5.01 |
| 5,272,560 | A * | 12/1993 | Baney | H01S 3/06795 359/249 |
| 5,502,558 | A * | 3/1996 | Menders | G01S 17/58 356/28.5 |
| 5,513,032 | A * | 4/1996 | Billmers | G02F 1/09 359/244 |
| 5,612,538 | A * | 3/1997 | Hackel | G01J 5/06 250/341.1 |
| 5,966,391 | A | 10/1999 | Zediker et al. | 342/22 |
| 6,205,159 | B1 * | 3/2001 | Sesko | H01S 5/141 372/20 |
| 6,643,311 | B2 | 11/2003 | Krupke | 372/56 |
| 7,061,958 | B2 | 6/2006 | Krupke | 372/55 |
| 7,884,944 | B2 * | 2/2011 | Vance | G02F 1/0126 356/327 |

OTHER PUBLICATIONS

Mark A Zentile et al. "Effect of line broadening on the performance of Faraday filters" Department of Physics, Durham University, South Road, Durham, DH1 3LE, United Kingdom. Apr. 14, 2015, pp. 1-5.*
Wei Zhuang et al. "Active Faraday optical frequency standards" Optical Society of America 2014, pp. 1-5.*
Peter van de Weijer et al. "Spectroscopic Investigation of the Mechanism of the Alkali Bead Detector for Gas Chromatography" Anal. Chem. Mar. 1, 1988, pp. 1380-1387.*
Mark A Zentile et al. "Optimization of atomic Faraday filters in the presence of homogeneous line broadening" J. Phys. B: At. Mol. Opt. Phys. 48 185001, Aug. 11, 2015, pp. 1-9.*
Junyu Xiong et al. "The characteristics of Ar and Cs mixed Faraday optical filter under different signal powers" IRRR Photonics Technology Letters. 2018, pp. 1-4.*
Gang Bi et al. "Ultranarrow linewidth optical filter based on Faraday effect at isotope 87Rb 420 nm transitions" Physics Letters a 380 (Oct. 12, 2016) pp. 4022-4026.*
Longfei Yin et al "Tunable rubidium excited state Voigt atomic optical filter" Optical Society of America, vol. 24, No. 6, Mar. 10, 2016, pp. 1-6.*
J. Menders et al. "Ultranarrow line filtering using a CS Faraday filter at 852 nm" Optics Letters, vol. 16, No. 11, Jun. 1, 1991, pp. 846-848.*
Wilhelm Kiefer et al. "Na-Faraday rotation filtering: The optimal point" Scientific Reports Oct. 9, 2014, pp. 1-7.*
Kristan L. Corwin et al. "Frequency-stabilized diode laser with the Zeeman shift in an atomic vapor" Applied Optics, vol. 37, No. 15, May 20, 1998 pp. 3295-3298.*

C. V. Shank et al. "Frequency locking a cw dye laser near atomic absorption lines in a gas discharge" Appl. Phys. vol. 23, No. 3, Aug. 1, 1973, pp. 156-157.*
A. Sargsyan et al. "Features of Faraday Rotation in Cs Atomic Vapor in a Cell Thinner than the Wavelength of light" ISSN 0021-3640, JETP Letters, 2015, vol. 102, No. 8, pp. 487-492.*
Matthias Widmann et al. "Faraday Filtering on the Cs-D-Line for Quantum Hybrid Systems" Institute of Physics. University of Stuttgart and Stuttgart Research Center of Photonic Engineering, May 7, 2015, pp. 1-4.*
Xiaobo Xue, "Faraday anomalous dispersion optical filter at 133Cs weak 459 nm transitions" Phonon. Res vol. 3, No. 5, Oct. 2015, pp. 275-278.*
Qinqin Su et al. "Electrodeless-discharge-vapor-lamp-based Faraday anomalous-dispersion optical filter" Optics Letters vol. 36, No. 23, Dec. 1, 2011, pp. 4611-4613.*
Yanfei Wang, et al. "Cs Faraday optical filter with a single transmission peak resonant with the atomic transitions at 455 nm" Optical Society of America vol. 20, No. 23, Optics Express, Nov. 5, 2012, pp. 25817-25825.*
Menders et al. "Blue cesium Faraday and Voigt magneto-optic atomic line filters" Optics Letters, vol. 17, No. 19, Oct. 1, 1992, pp. 1388-1390.*
S. Knappe et al. "Atomic vapor cells for miniature frequency references" IEEE, 2003, pp. 31-32.*
Mark. A. Zentile "Atomic Faraday filter with equivalent noise bandwidth less than 1 GHz" Department of Physics, Durham University, South Road, Durham, DH1 3LE, United Kingdom Feb. 25, 2015, pp. 1-4.*
James Keaveney et al. "A single-mode external cavity diode laser using an intra-cavity atomic Faraday filter with short-term linewidth < 400 kHz and long-term stability of < 1 MHz" Review of Scientific Instruments 87, 2016, pp. 09511-1 through 095111-4.*
Zhiming Tao et al. "Diode laser operating on an atomic transition limited by an isotope 87Rb Faraday filter at 780 nm" vol. 40, No. 18 / Sep. 15, 2015 / Optics Letters. pp. 4348-4351.*
Pengyuan Chang et al. "A Faraday laser lasing on Rb 1529 nm transition" Scientific Reports Aug. 21, 2017, pp. 1-8.*
P. P. Sorokin et al. "Frequency-Locking of Organic Dye Lasers to Atomic Resonance Lines", Applied Physics Letters, vol. 15, No. 6, Sep. 15, 1969, pp. 179-181.*
Xiaogang Zhang et al. "An all-optical locking of a semiconductor laser to the atomic resonance line with 1 MHz accuracy", 2013 Optical Society of America, Optics Express, pp. 28010-28018.*
Xiaobo Xue et a. "Faraday anomalous dispersion optical filter with a single transmission peak using a buffer-gas-filled rubidium cell" Optics Letters / vol. 37, No. 12 / Jun. 15, 2012/ pp. 2274-2276.*
Xinyu Miao et al. "Demonstration of an external-cavity diode laser system immune to current and temperature fluctuations" Review of Scientific Instruments 82, American Institute of Physics, (2011); pp. 086106-1 through 086106-3.*
Qinqing Sun et al. "Demonstration of an excited-state Faraday anomalous dispersion optical filter at 1529 nm by use of an electrodeless discharge rubidium vapor lamp" Applied Physics Letters 101, (2012), pp. 211102-1 through 211102-4.*
D. J. Dick et al. "Ultrahigh-noise rejection optical filter" Jun. 1, 1991/ vol. 16, No. 11/ Optics Letters, pp. 867-869.*
Xiong Junyu et al. "780nm Rubidium Faraday Anomalous Dispersion Optical Filter with Buffer Gas Xe" Abstract screenshot Apr. 26, 2018, p. 1.*
P.P. Sorokin et al. "Frequency-Locking of organic dye lasers to atomic resonance lines" Applied Physics Letters, vol. 15, No. 6, Sep. 15, 1969, pp. 179-181. (Year: 1969).*
Sorokin et al, Frequency-Locking of Organic Dye Lasers to Atomic Resonance Lines, Applied Physics Letters, vol. 15, No. 6; Sep. 15, 1969, pp. 179-181.
Zielinska et al, Ultra-Narrow Faraday Rotation Filter at the Rb, D1 Line, Optical Society of America, Feb. 7, 2012; pp. 1-3.

\* cited by examiner

US 10,224,687 B1

LASER WITH INTRACAVITY NARROWBAND MAGNETO-OPTIC ATOMIC FILTER

RELATED APPLICATION

This application claims the benefit of U.S. Provisional Application No. 62/182,812 filed Jun. 22, 2015, which is herein incorporated by reference.

FIELD OF THE INVENTION

The invention relates in general to intracavity atomic vapor lasers operating on resonant atomic transitions using an External Cavity Laser Diode (ECLD) and more particularly to improving the efficiency, temperature independence, and wavelength narrowing and accuracy of a beam with a minimum of optical elements.

BACKGROUND OF THE INVENTION

A class of diode pumped alkali vapor lasers (DPAL) demonstrated by Krupke, in U.S. Pat. Nos. 6,643,311 and 7,061,958 B2 requires resonantly matched optical pumps with a spectral width greater than 10 picometers and wavelength corresponding to the D2 transition. The D2 transition occurs between the ground $^2S_{1/2}$ state and the excited $^2P_{3/2}$ state. The DPAL is pumped by bleaching to the D2 transition and simultaneously shifting the population of the $^2P_{3/2}$ excited state to the $^2P_{1/2}$ state (D1) by spin-orbit mixing. The output wavelength of the DPAL corresponds to the D1 transition.

The natural D2 absorption linewidth is on the order of a few picometers, and the linewidth of most high power diode pump sources had been on the order of tens of thousands of picometers. This mismatch of linewidths did not promote high optical energy conversion efficiency of the pump process. The prior art shows that both increasing the pressure of the alkali vapor and adding selected buffer gases to broaden the D2 spectral line improved energy conversion efficiency. Helium is a common buffer gas, and pressures of several atmospheres have been used. A similar pumping and lasing scheme is known involving metastable rare noble gases having the electronic configuration $np^5(n+1)s^3P_2$.

To further improve energy conversion efficiency, extensive research in this field has concentrated on reducing the linewidth and locking the wavelength of pump lasers to the D2 transition. Linewidths on the order of 50 picometers or less are currently preferred. Semiconductor lasers with Volume Bragg Gratings (VBG) are often employed for this dual purpose, for example as disclosed in U.S. Pat. No. 7,697,589.

One major disadvantage of VBGs is internal heating caused by the absorption of optical power. Thermal expansion changes the dimensional periodicity of the active grating causing detuning of the wavelength. This effect limits the useful optical power passing through such components to the range of 20-40 W/cm$^2$.

Another disadvantage of VBGs is its wavelength inaccuracy, which must be thermally compensated. Published specifications for the wavelength accuracy of commercial VBG's are typically about ±500 picometers. Because the typical temperature dependence of the laser diode wavelength is about 300 picometers per degree C., the precise resonant wavelength can be thermally tuned by controlling the temperature to within a range of a few degrees C. Strict temperature control (on the order of ±0.05 per degree C.) must then be maintained to stabilize the wavelength.

In addition, VBGs exhibit a dependence of the wavelength of about 7 picometers per degree C. placing further constraints on temperature control.

Birefringent filters (BRF) have also been shown in (U.S. Pat. No. 7,061,958 B2) to promote narrowing of the line width, for example as disclosed in U.S. Pat. No. 7,061,958. However, BRFs require a servo to lock the wavelength, as discussed in U.S. Pat. No. 5,218,610 and references therein. Furthermore, high power BRFs are expensive and very difficult to make.

Faraday Anomalous Dispersion Optical Filters (FADOFs) have been demonstrated to reduce laser linewidth in flash-pumped organic dye lasers to less than 5 picometers and in semiconductor lasers to less than 10 picometers. In addition, a FADOF filter used in combination with a saturated absorption cell was shown to lock the wavelength of a tunable semiconductor external cavity laser diode. All of this prior art utilized a classic FADOF filter configuration with two polarizers.

Additionally, there is a need to reduce the number of optical elements in optical systems to reduce cost and improve transmission efficiencies.

SUMMARY OF THE INVENTION

Embodiments of this invention are directed to a class of diode pumped, alkali, and periodic group VIII (noble gases) atomic resonant lasers. These lasers utilize spin-orbit mixing of two exited states radiatively coupled by a dipole-dipole transition to a common lower energy state. This lower state can be a ground state ($^2S_{1/2}$) of an alkali metal or a metastable state ($^3P_2$ or $^3P_0$) of a noble gas. The laser mechanism requires bleaching of the lower state.

The present invention integrates a FADOF Faraday filter into a semiconductor-pumped laser or Diode Pumped Alkali Laser (DPAL). In the present invention the FADOF filter is located between the semiconductor pump laser and the DPAL gain medium. Light transmitted from the laser and through the filter and DPAL gain medium then passes through a polarizer and a Glan-Thompson prism. A reflecting mirror returns the light back in the opposite direction to the laser through the same optical path. The filter transmits only a narrow optical band matching the atomic wavelength resonance (D2) of the vapor. A resonant cavity is established between the highly reflective back mirror of an External Cavity Laser Diode (ECLD) chip and the reflecting mirror. The FADOF filter forces the ECLD to self-lock at this resonant wavelength.

For the purpose of the invention an ECLD has a structure similar to a semiconductor laser except that the reflectivity of the exit facet is very low to prevent the device from lasing and generally has a broad emission spectrum. Furthermore, a semiconductor gain chip (gain chip) has a structure similar to a semiconductor laser except that the reflectivity of both exit and back facets are very low.

Incoherent Amplified Stimulated Emission (ASE) from the ECLD as well as other parasitic luminescence (PL) and stray light falling outside of the atomic resonance wavelength band do not resonate with the gain medium. Consequently, the polarization plane is not rotated by the FADOF filter, and this light is blocked by the Glan-Thompson prism preventing resonance within the cavity. A high degree of spectral purity in the pumping beam results.

A key property of the present invention is that the wavelength of the semiconductor laser pump self-locks to the resonant wavelength of the DPAL gain medium. A second key property, as supported by empirical data, is that the linewidth of the self-locked pump beam is within the absorption profile of the DPAL gain medium under broad physical-chemical conditions. The semiconductor ECLD has a gain curve for wavelengths that include and overlap the resonant atomic transition wavelength of the gain medium of the vapor cell within the resonant cavity of the DPAL.

These key properties are realized by the incorporation of four features into the present invention. The first feature is that only one polarizer is used instead of two. This simplification is realized by taking advantage of the property of the semiconductor laser chip that the emitted light is already polarized in the plane of the p-n junction. The use of a single polarizer simplifies the design and reduces assembly and materials costs.

The second feature is that the active medium of the FADOF filter and the gain medium of the DPAL are the same component, that is the functions of the FADOF filter and the DPAL medium are integrated. This simplifies the design of the DPAL system and reduces materials and assembly costs.

In another embodiment of the present invention has opposing windows set at a Brewster's angle and rotated 90° relative to each other. This embodiment makes possible the elimination of a polarizer used in the other embodiments.

The third feature is use of a flame as a host for the gain medium for alkali metal DPALs.

A fourth feature of an embodiment of the invention is that a cell containing the atomic vapor has windows tiled at the Brewster angle relative to the beam.

Accordingly, it is an object of the present invention to reduce the cost of a DPAL and provide a narrow linewidth.

It is another object of the present invention to increase output power.

It is an advantage of the present invention that the ECLD is self-locking to the resonant wavelength of the DPAL gain medium.

It is a further advantage of the present invention that optical losses are reduced and a polarizer element is eliminated.

It is another advantage of the present invention that it has improved temperature independence.

It is yet another advantage of an embodiment of the invention that a high pressure system for the gain medium is eliminated.

It is another advantage in one embodiment of the present invention that the Glan-Thompson prism may be eliminated.

It is a feature of the present invention that the location of the FADOF is between the ECLD and the DPAL gain medium.

It is another feature of the present invention that the medium of the FADOF and the DPAL are integrated.

It is yet another feature of an embodiment of the present invention that a flame or plasma is used as host for the gain medium.

It is still yet another feature of an embodiment of the present invention that windows in the atomic vapor cell are set at a Brewster angle and rotated 90° with respect to each other.

These and other objects, advantages, and features will become more readily apparent in view of the following more detailed description.

DETAILED DESCRIPTION OF THE PREFERRED EMBODIMENT

The following detailed description is currently the best contemplated mode of carrying out the exemplary embodiments of the invention. The description is not to be taken in a limiting sense, but is made merely for the purpose of illustrating the general principles of the invention, since the scope of the invention is best defined by the appended claims. Various inventive features are described below that can each be used independently of one another or in combination with other features. However, any single inventive feature may not address all the problems discussed above or may only address one of the problems discussed above. Further, one or more of the problems discussed may not be fully addressed by any of the features described below.

Figure 1A:
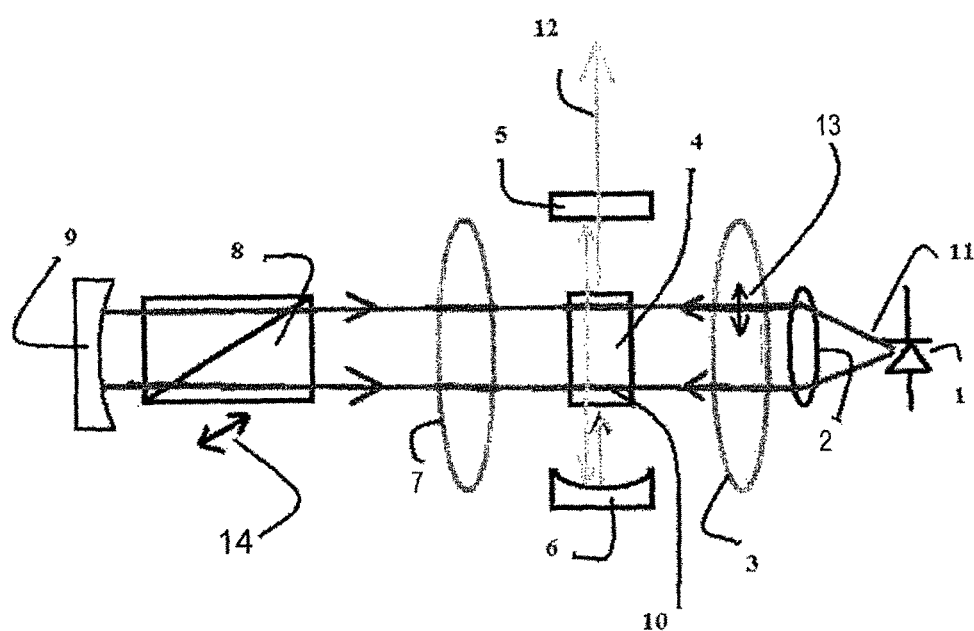
FIG. 1A schematically illustrates a DPAL Laser with ECLD pump locked by a FADOF Filter with the optical pumping configuration being transverse.

Embodiments of the present invention are exhibited in the components shown in FIG. 1A. The ECLD 1 in this embodiment was obtained from AXCEL Corporation. The peak wavelength of the gain spectrum is 780 nm+/−2 nm, and has front facet and back facet reflectivity of 0.5% and 95%, respectively. The diverging radiation beam 11 from the ECLD is collimated by aspheric lens 2 or combination of cylindrical lenses. The power of the emitted energy is sufficient to bleach the D2 transition. The electrical vector of the polarized beam 13 emitted from the ECLD 1, which lies in the plane of the p-n junction (also the plane of the page as depicted in FIG. 1A), passes through a neodymium-iron-boron cylindrical permanent magnet 3 with axial magnetization oriented such that its magnetic vector is parallel to the path of the ECLD beam. The ECLD beam passes through zone 4, which contains alkali metal atoms with effective agents for D2 to D1 spin-orbit mixing. Zone 4 may be an atomic vapor cell. The concentration or atom density is typically in the range of $10^{10}$-$10^{14}$ cm$^{-3}$. According to the principle of the FADOF filter, the electrical vector of the ECLD beam undergoes rotation as it passes through zone 4. The ECLD radiation beam 11 passes through the second permanent magnet 7. Although not necessary, the purpose of the second magnet is to homogenize the magnetic field and adjust its strength for initiating the anomalous Zeeman effect. The Zeeman effect is the splitting of a spectral line into several components in the presence of a static magnetic field.

The polarizer 8, typically a commercial Glan-Thompson, Glan-Tylor, or Glan-Laser prism having extinction ratio of 1:1000 or higher, is set at an angle 14 typically close to 90 degrees with respect to the original ECLD beam polarization 13 to quench the light intensity. When alkali metal atoms are not present in zone 4 or are below the required number density the beam is strongly attenuated by the polarizer, and does not return to the ECLD as an optical feedback signal. However with presence of resonating atoms at a sufficient number ore high density in the zone 4, an adequate magnetic field strength, and adequate working length of the FADOF, rotation of the plane of polarization of photons participating in the D2 transition is enabled. Photons with rotated plane of polarization pass through the polarizer 8 and return to the ECLD 1 in one or many roundtrips, leading to wavelength lock at the characteristic, narrow, FADOF bandwidth. Those skilled in art of atomic physics will recognize the operational principles of a FADOF filter, which in this configuration narrows the bandwidth of the wavelength to few picometers. Moreover those skilled in the art will appreciate the lack of the entry point polarizer typically present in prior or legacy systems located between the aspherical lens 2 and the magnet 3, which greatly reduces the cost of the system of the present invention.

The high reflective mirror 9 provides the feedback to the ECLD 1. The DPAL gain medium under bleaching conditions for the D2 transition has an inverted population of D1 atoms in the $^2P_{1/2}$ state. This population exhibits strong optical gain. The mirrors 5 and 6 have reflective coatings preferring the D1 transition. If these mirrors are aligned, the D1 laser beam 12 is generated. In the embodiment shown in FIG. 1A, the orientation of these mirrors with respect to the path of the optical pump beam is transverse.

Figure 1B:
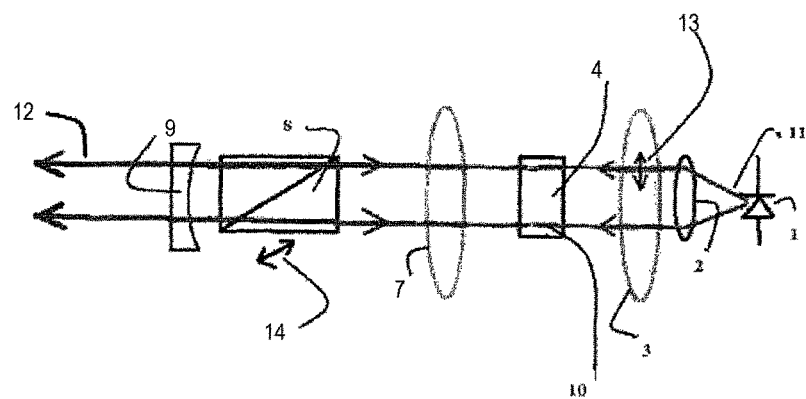
FIG. 1B schematically illustrates a generic configuration with FADOF filter for narrowing the laser wavelength of ECLD which has only one polarizer and employs alkali or alkali earth resonant medium of atomic vapors for purpose of generating a single wavelength.

FIG. 1B illustrates another embodiment of the invention. The diverging radiation 11 from the ECLD 1 is collimated by aspheric lens 2 or combination of cylindrical lenses. The electrical vector of the polarized beam emitted from the ECLD 1, which lies in the plane of the p-n junction, also the plane of the page as depicted in FIG. 1B, is illustrated by arrow 13 and passes through a neodymium-iron-boron permanent magnet 3. Magnet 3 has an axial magnetization oriented such that its magnetic vector is parallel to the path of the ECLD collimated beam 10. The collimated ECLD beam 10 passes through zone 4, which contains alkali earth metal atoms and exits semitransparent mirror 9 as laser beam 12. For example, zone 4 can contain calcium vapor contained in a quartz cell. The laser diode ECLD 1 has a broad gain curve at the wavelength of 422 nm, which is the resonant wavelength for calcium atoms. The concentration or atom density which is temperature dependent and the length of the cell or container of zone 4 are designed to provide a sufficient rotation of polarized light. Photons with a rotated plane of polarization pass through the polarizer 8 and return to the ECLD 1 in one or many roundtrips, leading to wavelength lock at the characteristic, very narrow, FADOF bandwidth which is typically less than 20 picometers. Semitransparent mirror 9 provides the feedback to the ECLD 1 and out-couples a portion of the beam power, typically more than 70%. Again those skilled in the art will appreciate the lack of the entry point polarizer typically present in legacy or prior systems located between lens 2 and magnet 3. This elimination of the entry point polarizer greatly reduces the cost and complexity of the system and provides a wavelength locked to 422.673 nm of calcium. Those skilled in the art will recognize that other metal vapors and or wavelengths can control the laser wavelength. That is, other elements may be used to obtain different wavelengths. For example, strontium at 460.772 nm or barium 553.548 nm may be loaded in the container or cell of zone 4 providing that a relevant gain curve of the ECLD 1 exist.

Figure 1C:
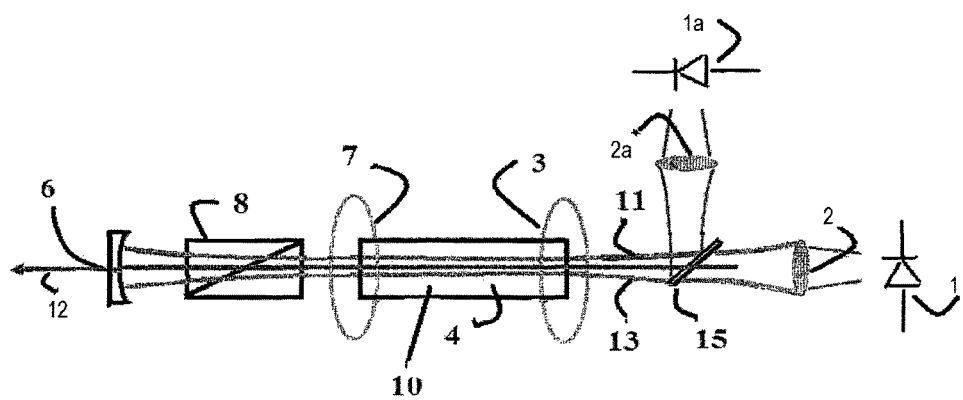
FIG. 1C schematically illustrates another embodiment of the invention having a two ECLDs with spectrally diversified spectral ranges and matching alkali or alkali earth resonant medium of alkali or alkali earth medium for the purpose of simultaneous operation on two resonant wavelengths FIG. 2 schematically illustrates an embodiment using a flame as the host for the gain medium and axial D1 laser extraction.

FIG. 1C illustrates another embodiment of the invention having two or dual wavelengths. This embodiment also uses an integrated FADOF filter. As illustrated in FIG. 1C the optical path between the gain chips or ECLDs 1 and 1a and a partially reflecting mirror 6 comprises the resonance cavity. This embodiment is based on or similar to the single wavelength device shown in FIG. 1B. This embodiment contains a non-polarizing beam splitter 15 optimized for reflectivity at a wavelength of 780 nm from the first ECLD 1 and transmission of a wavelength of 852 nm from the second ECLD 1a, and preserving original linear polarization of light from the first ECLD 1 and the second ECLD 1a. The lenses 2 and 2a collimate the radiation. The non-polarizing beam splitter 15 collinearly merges the beams 11 and 13 emitted from the ECLD's 1 and 1a at their respective wavelengths of 780 nm and 852 nm. The merged beams 11 and 13 pass through a high temperature cell 4 containing a mixture of rubidium and cesium vapors. Permanent magnets 3 and 7 are strategically positioned near the cell 4 so as to form part of the integrated FADOF filter. The beams 11 and 13 then pass through a Glan-Thompson-type polarizer 8 having a polarization originally oriented at 90 degrees relative to the planes of polarization of the two ECLDs 1 and 1a. A partially reflecting mirror 6 diverts a portion of the beams 11 and 13 back into the cavity. Given a sufficient optical density of each vapor in the cell 4 and sufficient strength of the magnetic field, the plane of polarization is rotated in the FADOF filter by the anomalous Zeeman Effect. Only photons undergoing atomic resonance experience rotation and are able to pass-through the polarizer without extinction. Therefore, the FADOF filter provides high selectivity to the atomic transition with a bandwidth of about 10 picometers, and wavelengths outside of this band are suppressed. The output dual wavelength beam 12 has a polarization ratio of 1:100000.

This embodiment has the advantage of providing two different wavelengths at the predetermined precise wavelengths of 780 nm and 852 nm.

Those skilled in art may appreciate the fact that cell 4 may contain other combinations of vapors, for example potassium and cesium or metal vapors of elements in periodic group II.

Figure 2:
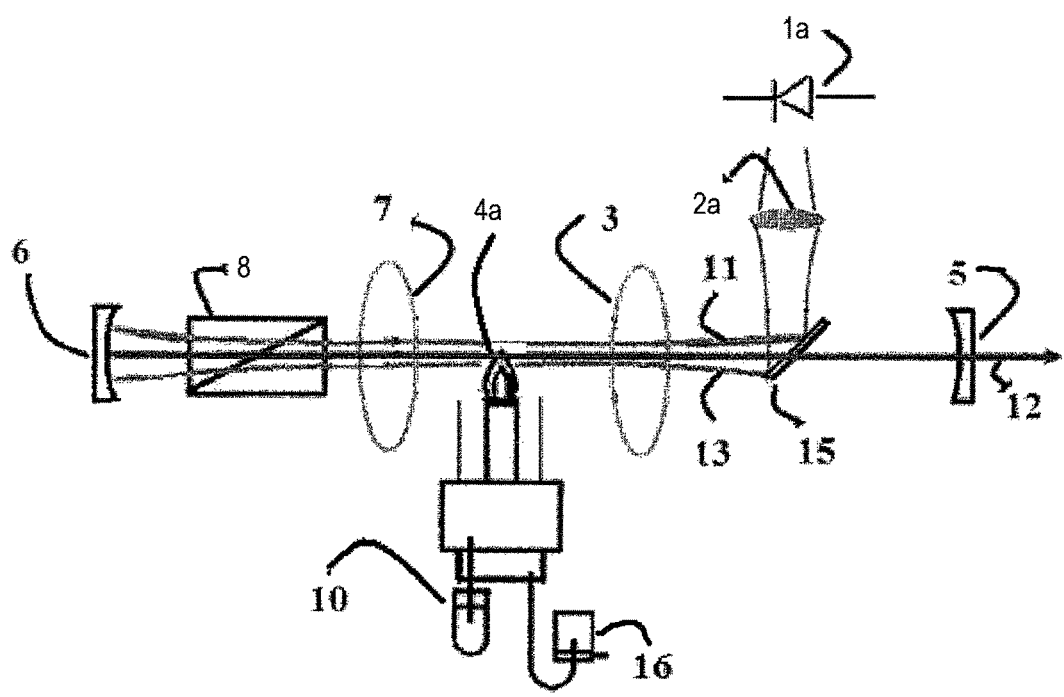

FIG. 2 is another embodiment of the present invention. This embodiment has an axial, or "heads-up" orientation of mirrors 5 and 6. The polarized pump beam 11 emitted from ECLD 1a is collimated by lens 2a. Mirror 6 has a high reflecting coating for D2 and D1 wavelengths. The beam splitter 15 injects the pump beam 11 into pumping zone 4a. A suitable beam splitter 15 may be obtained from Spectral Optics Corporation. The output coupler mirror 5 has reflectivity required to sustain lasing at the D1 wavelength, which is typically 30%. The pumping scheme incorporates a beam splitter 15 to provide spatial overlap of the pump beam and the D1 laser beam. This scheme draws from designs of laser folded cavities, which are very well known from prior art. The same prior art discusses the benefits of polarizing beam splitters and orthogonal adjustments of the pump beam and the laser. The Glan-Thompson polarizer 8 is orthogonally adjusted to the polarization plane of ECLD 1. A suitable polarizer 8 may be obtained from Karl Lambrecht Corporation In another embodiment of the present invention the gain medium in cell 4 may contain alkali vapors or metastable noble gas atoms mixed with appropriate buffer gases to promote spin-orbit mixing.

FIG. 2 also illustrates a third feature of the invention. A flame is used as the host for the gain medium in pumping zone 4a. The flame could be oxy-hydrocarbon, oxy-hydrogen, or acetylene-nitrous oxide type. In broader terms, the flame could be replaced with plasma. Those skilled in art will also recognize that the pumping zone 4a can utilize a column of low ionized plasma containing metastable atoms of noble gases instead of a fuel-based flame. Fuel, oxidant, and buffer gases entering through regulators 16 are mixed with a nebulized 10 having a water solution of the alkali metal salt providing the source of metal atoms in gain medium used in pumping zone 4a. Conditions of atomization are similar to those practiced in flame photometry for chemical analysis, for example as disclosed in U.S. Pat. No. 3,550,858, which is herein incorporated by reference. The high temperature of the flame causes dissociation of the alkali metal salt into atomic species.

Figure 3:
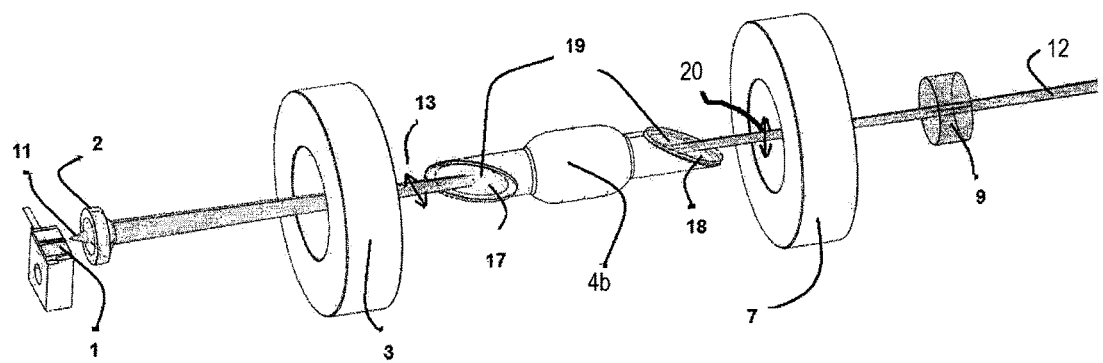
FIG. 3 schematically illustrates an embodiment using an atomic vapor cell having windows positioned at the Brewster angle and rotated 90° relative to each other.

FIG. 3 schematically illustrates another embodiment of the present invention. In this embodiment the polarizer 8, illustrated in FIGS. 1A-B and 2, is eliminated. This embodiment further reduces the cost and improves optical efficiency by eliminating the beam splitter. In FIG. 3 the ECLD 1 generates a divergent radiation beam 11 that is collected by collimating lens 2. The beam passes through hollow cylindrical permanent magnet 3 and emerges with a polarization direction illustrated by arrow 13. Vapor cell 4b contains a metal vapor. The vapor cell 4b may be a high temperature ceramic cell filled with selected metals belonging to group I and II of the periodic table and a combination of elements and mercury and metastable atoms of group VIII. Windows of 17 and 18 on opposing ends of the vapor cell 4b are angled at a Brewster's angle. The windows 17 and 18 may have an internal film coating 19 blocking diffusion of metal vapors into the window. The film coating 19 may be physically or chemically deposited and may comprise barium fluoride or barium borate. The windows 17 and 18 may also be made of barium borate glass. The Brewster's angle is an angle of incidence at which light with a particular polarization is perfectly transmitted through a transparent dielectric surface with no reflection. The windows 17 and 18 are angled and rotated 90° relative to each other. The radiation beam exiting window 18 has a direction of polarization indicated by arrow 20. The polarization indicated by arrow 20 is substantially perpendicular to the polarization indicated by arrow 13. The rotation of the orientation of the polarization is due to the Faraday effect inside the vapor cell 4b. Upon passing through the hollow cylindrical permanent magnet 7 the beam is partially reflective by highly reflective semitransparent mirror 9. The laser beam 12 then emerges from the semitransparent mirror 9. The resonance cavity or laser cavity is formed between the ECLD 1 and the semitransparent mirror 9.

The windows 17 and 18 being positioned at the Brewster's angle, linearly polarizes the light. The windows 17 and 18 eliminate the need for a polarizer or Glan-Thompson prism used in prior FADOF lasers. The relative rotation between the windows 17 and 18 may deviate slightly from 90° due to birefringent properties of the material of the windows 17 and 18. However, in general, the relative rotation of the polarization of the radiation beam is fundamental to the magneto-optic narrowband filtering of atomic resonant light.

Several atomic transitions manifest extremely strong magneto-optic properties that can be used in the present invention. For example, the following are resonant transitions of elements that can be used in the present invention: cesium, 455.5 nm, 459.52 nm, 852.1 nm, 894.35 nm; rubidium 420.18 nm, 421.55 nm, 780.02 nm, 794.76 nm; potassium 404.4 nm, 766.48, 769.89; sodium 588.99 nm, 589.59 nm; and mercury, 253.7 nm.

Additionally, calcium 422 nm and strontium 461 nm both have strong Verdet constants at resonant wavelengths and their vapors can be used to frequency lock the laser wavelength. Also metastable states of excited atoms for example from group VIII of the periodic chart of elements, have electron configurations analogous to transitions used in the present invention and may also be used.

The present invention solves the prior art problem of controlling wavelength accuracy because the semiconductor laser pump self-locks to the resonant wavelength of the DPAL gain medium. The prior art problem of linewidth matching is also solved because the linewidth of the self-locked pump beam is within the absorption profile of the DPAL gain medium under broad physical-chemical conditions. Consequently, the need for tuning the pressure of the gain medium to the pump no longer exists eliminating the need for a high pressure system. This reduces the cost of the equipment and its operation, and increasing system reliability. The present invention involves no VBG avoiding the associated limitations of damage thresholds. The present invention also involves no BRF avoiding the need for tuning. Furthermore, the use of a Glan-laser polarizer expands the operating irradiance range to about 500 W/cm$^2$ (CW) with the direct consequence of higher output power of the DPAL laser. Also, unlike diffraction gratings, FADOF accepts relatively broad angular ray content for alignment purposes. Finally, the present invention can operate at sub-atmospheric pressures.

It has been shown that within a temperature range of about +3° C. of the ECLD the self-locking mechanism is independent of temperature. Consequently, the tolerance for temperature control is widened.

Regarding the use of a flame as host for the gain medium, the resulting embodiment is significantly different from legacy or prior DPAL lasers in terms of both mechanical and physical-chemical conditions. First, the need for a hermetic containment vessel is virtually eliminated. Further, the location of the alkali metal vapors is determined by the temperature profile and interconal zone structure of the flame. Second, the present invention utilizes the products of combustion, including ($CO_2$, $H_2O$) and hot nitrogen, which are excellent spin-orbit mixers in the high temperature flame environment (see Table 1), and have spin-orbit mixing cross-sections comparable to hydrocarbon mixers used in legacy or prior DPAL lasers.

TABLE 1

VARIOUS RUBIDIUM-GAS COLLISIONAL PROPERTIES

| Collision Partner | $\sigma\ p_{3/2} \to p_{1/2}$ ($10^{-16}$ cm$^2$) | Temperature (K) | References |
| --- | --- | --- | --- |
| $N_2$ | 18.4 ± 2.2 | 330 | 18 |
| $N_2$ |  | 340 | 19 |
| $N_2$ |  | 1720 | 19 |
| $N_2$ | 60 ± 12 | 1720 | 20 |
| $N_2$ | 23 | 340 | 21 |
| $N_2$ | 7 | 300 | 22 |
| $O_2$ | 40 ± 20 | 1720 | 20 |
| HD | 25 | 340 | 21 |
| $H_2O$ | 73 ± 15 | 1720 | 20 |
| $CH_4$ | 41.0 ± 5.0 | 330 | 18 |
| $CH_4$ | 36 | 340 | 23 |
| $CH_4$ | 42 | 340 | 21 |
| $CF_4$ | 13.2 ± 1.6 | 330 | 18 |
| $CD_4$ | 36 | 340 | 23 |
| $CD_4$ | 38 | 340 | 21 |

TABLE 1-continued

VARIOUS RUBIDIUM-GAS COLLISIONAL PROPERTIES

| Collision Partner | $\sigma\, p_{3/2} \rightarrow p_{1/2}$ ($10^{-16}$ cm$^2$) | Temperature (K) | References |
|---|---|---|---|
| CH$_2$D$_2$ | 37 | 340 | 23 |
| C$_2$H$_4$ | 32 | 340 | 21 |
| C$_2$H$_6$ | 77 | 340 | 21 |

While the present invention has been described with respect to several different embodiments, it will be obvious that various modifications may be made without departing from the spirit and scope of this invention.

What is claimed is:

1. A laser providing a predetermined linewidth of radiation comprising:
   a laser diode emitting radiation having a wavelength spectrum broader than and including a predetermined linewidth of radiation and the wavelength spectrum having a first direction of polarization;
   a flame gain medium of alkali earth metal atoms having an atomic resonant wavelength and positioned to receive the radiation emitted from said laser diode;
   a polarizer element set to attenuate radiation having the first direction of polarization;
   a mirror placed adjacent said polarizing element and positioned to reflect the atomic resonant wavelength back to said laser diode; and
   a magneto-optic filter placed between said laser diode and said polarizer element,
   whereby said magneto-optic filter rotates a plane of polarization of the radiation at the atomic resonant wavelength to other than the first direction of polarization and said polarizing element attenuates radiation wavelengths having the first direction of polarization.

2. A laser as in claim 1 wherein:
   said laser diode comprises an ECLD.

3. A laser as in claim 1 wherein:
   said magneto-optic filter is a FADOF.

4. The laser providing a predetermined linewidth of radiation as in claim 1 further comprising:
   a nebulizer coupled to said flame gain medium, said nebulizer comprising fuel, oxidant, and water.

5. The laser providing a predetermined linewidth of radiation as in claim 1 wherein:
   the atomic resonance wavelength comprises D1 and D2 atomic transition wavelengths of the alkali earth metal atoms and the D1 atomic transition wavelength is extracted as the laser having the predetermined linewidth of radiation.

6. A semiconductor pumped laser comprising:
   a laser diode having an emission spectrum and a back mirror, the emission spectrum having a first polarization plane;
   a collimating lens adjacent said laser diode, whereby a collimated emission spectrum is formed;
   a flame gain medium containing alkali earth metal atoms placed within the collimated emission spectrum, said gain medium having an atomic resonance wavelength transition;
   a Faraday filter comprising said gain medium;
   a polarizer orthogonally adjusted to the first polarization plane and following said Faraday filter; and
   a mirror placed adjacent said polarizer,
   whereby a resonant cavity is formed between the back mirror of said laser diode and said mirror and said laser diode is self-locked at the atomic resonance wavelength transition.

7. A semiconductor pumped laser as in claim 6 further comprising:
   a nebulizer coupled to said flame gain medium, said nebulizer comprising fuel, oxidant, and water.

8. A semiconductor pumped laser as in claim 6 wherein:
   the atomic resonance wavelength transition comprises D1 and D2 atomic transition wavelengths of the alkali earth metal atoms and the D1 atomic transition wavelength is extracted as the laser.

9. A laser providing a predetermined linewidth of radiation comprising:
   a laser diode having a front facet with lower reflectivity than a back facet emitting a pump beam radiation having a wavelength spectrum broader than and including the predetermined linewidth of radiation;
   a first and second mirror positioned on a common optical axis;
   a beam splitter positioned on the common optical axis between said first and second mirror, and positioned to receive the pump beam radiation from said laser diode;
   a pumping zone positioned between the first and second mirrors and positioned to receive the pump beam radiation from said laser diode reflected by said beam splitter;
   a FADOF filter placed on the common optical axis of said first and second mirrors;
   a flame comprising a gain medium positioned in the pumping zone between the first and second mirrors and positioned to receive the pump beam radiation from said laser diode;
   a nebulizer coupled to said flame, said nebulizer comprising fuel, oxidant, buffer gas, and a water solution of an alkali metal salt providing a source of metal atoms for the gain medium, the metal atoms having a predetermined resonant atomic transition wavelength; and
   wherein said FADOF filter comprising the gain medium has a bandwidth matching the predetermined resonant atomic transition and wavelength blocking wavelengths falling outside of the predetermined resonant atomic transition wavelength,
   whereby said flame is capable of being host for the gain medium eliminating a need for a rigid containment vessel for the gain medium.

10. The laser as in claim 9 wherein:
    said flame has products of combustion comprising carbon dioxide, water, and nitrogen.

11. The laser as in claim 9 wherein:
    said flame is selected from the group consisting of oxy-hydrocarbon, oxy-hydrogen, and acetylene-nitrous oxide.

12. The laser as in claim 9 wherein:
    said flame comprises a plasma.

13. A laser providing a predetermined linewidth of radiation comprising:
    a laser diode emitting a pump beam radiation having a wavelength spectrum including a wavelength corresponding to a D2 transition atomic resonance wavelength of an alkali metal salt;
    a first and second mirror positioned on a common optical axis;
    a beam splitter positioned on the common optical axis between said first and second mirror, and positioned to receive the pump beam radiation from said laser diode;

a pumping zone positioned between the first and second mirrors and positioned to receive the pump beam radiation from said laser diode reflected by said beam splitter;

a FADOF filter placed on the common optical axis of said first and second mirrors;

a flame comprising a gain medium positioned in the pumping zone between the first and second mirrors and positioned to receive the pump beam radiation from said laser diode, wherein the gain medium of said flame comprises an alkali metal salt and water placed, whereby electron spin-orbit mixing results in a transition from the D2 transition atomic resonance wavelength of the alkali metal salt to a D1 transition atomic resonance wavelength of the alkali metal salt; and wherein the second mirror has a partial reflectivity sufficient to sustain lasing at the D1 transition atomic resonance wavelength of the alkali metal salt permitting the D1 transition atomic resonance wavelength of the alkali metal salt to emerge from the second mirror along the common optical axis, whereby said flame is capable of being host for the gain medium eliminating a need for a rigid containment vessel for the gain medium and the D1 transition atomic resonance wavelength of the alkali metal salt emerges as the predetermined linewidth of radiation of the laser.

14. A laser providing a predetermined linewidth of radiation as in claim 13 wherein:

the partial reflectivity of the second mirror is thirty percent at the D1 transition atomic resonance wavelength of the alkali metal salt.

* * * * *